United States Patent
Herz et al.

(10) Patent No.: US 8,044,320 B2
(45) Date of Patent: Oct. 25, 2011

(54) METHOD AND APPARATUS FOR THE CORRECTION OF DEFECTIVE SOLDER BUMP ARRAYS

(76) Inventors: Enrico Herz, Frauendorf (DE); Michael Teich, Moritzburg OT Friedewald (DE); Axel Becker, Dresden (DE)

( * ) Notice: Subject to any disclaimer, the term of this patent is extended or adjusted under 35 U.S.C. 154(b) by 647 days.

(21) Appl. No.: 12/018,506

(22) Filed: Jan. 23, 2008

(65) Prior Publication Data

US 2008/0173697 A1   Jul. 24, 2008

(30) Foreign Application Priority Data

Jan. 23, 2007   (DE) .......................... 10 2007 004 253

(51) Int. Cl.
*H01L 23/48* (2006.01)

(52) U.S. Cl. .............. 219/121.65; 219/121.66; 438/613; 228/246; 228/41

(58) Field of Classification Search ............. 219/121.65, 219/121.66, 121.6, 121.82, 121.85; 228/246, 228/41, 180.22; 438/612, 613
See application file for complete search history.

(56) References Cited

U.S. PATENT DOCUMENTS

| 5,381,848 | A | * | 1/1995 | Trabucco | 164/102 |
| 5,620,129 | A | * | 4/1997 | Rogren | 228/56.3 |
| 5,620,927 | A | * | 4/1997 | Lee | 29/841 |
| 5,673,846 | A | * | 10/1997 | Gruber | 228/180.22 |
| 6,024,275 | A | * | 2/2000 | Takiar | 228/180.22 |
| 6,268,275 | B1 | * | 7/2001 | Cobbley et al. | 438/612 |
| 6,685,080 | B1 | * | 2/2004 | Kee et al. | 228/103 |
| 6,911,388 | B2 | * | 6/2005 | Kee et al. | 438/613 |
| 7,481,352 | B2 | * | 1/2009 | Teutsch et al. | 228/191 |
| 2003/0111449 | A1 | * | 6/2003 | Sinkunas et al. | 219/121.85 |
| 2008/0179035 | A1 | * | 7/2008 | Gruber et al. | 164/113 |

* cited by examiner

*Primary Examiner* — Samuel M Heinrich
(74) *Attorney, Agent, or Firm* — Heslin Rothenberg Farley & Mesiti P.C.

(57) ABSTRACT

Disclosed is a method and apparatus for the correction of defective solder bump arrays arranged in a plurality of cavities in a mold. In the method, a faulty solder bump is searched, identified and located (i.e., its position is determined) in an arrangement of solder bumps disposed in cavities of a mold and the faulty solder bump is subsequently replaced by a prefabricated solder bump. The apparatus for carrying out the method comprises a mold holder, a scanning and locating device for finding and locating faulty solder bumps and a repair device for replacing the faulty solder bump by a prefabricated solder bump.

17 Claims, 3 Drawing Sheets

Figure 1:
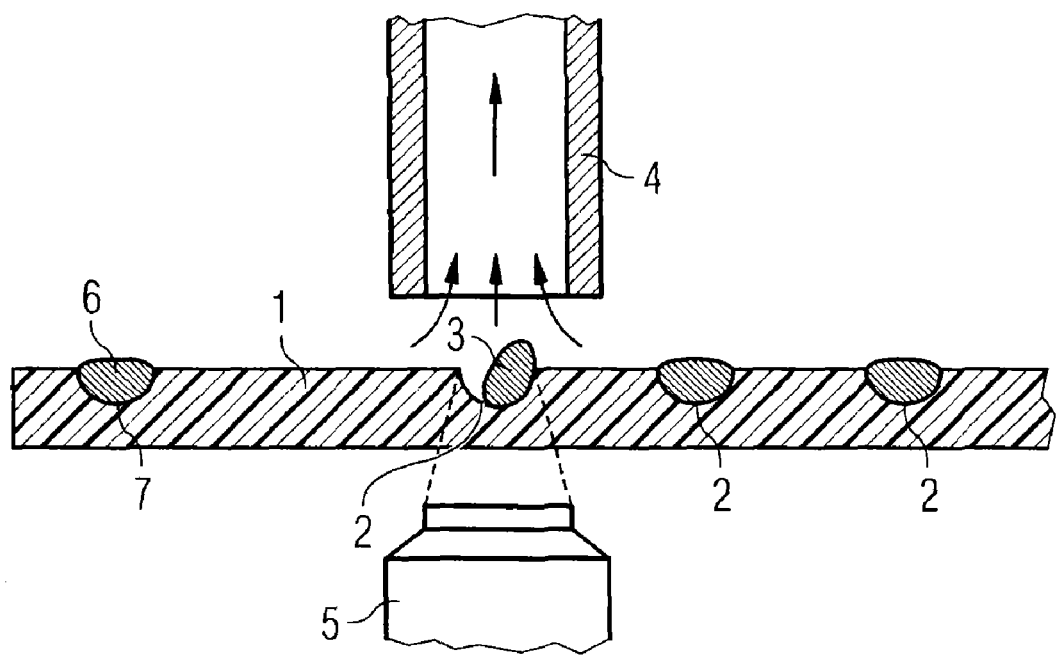

FIG 2
a)
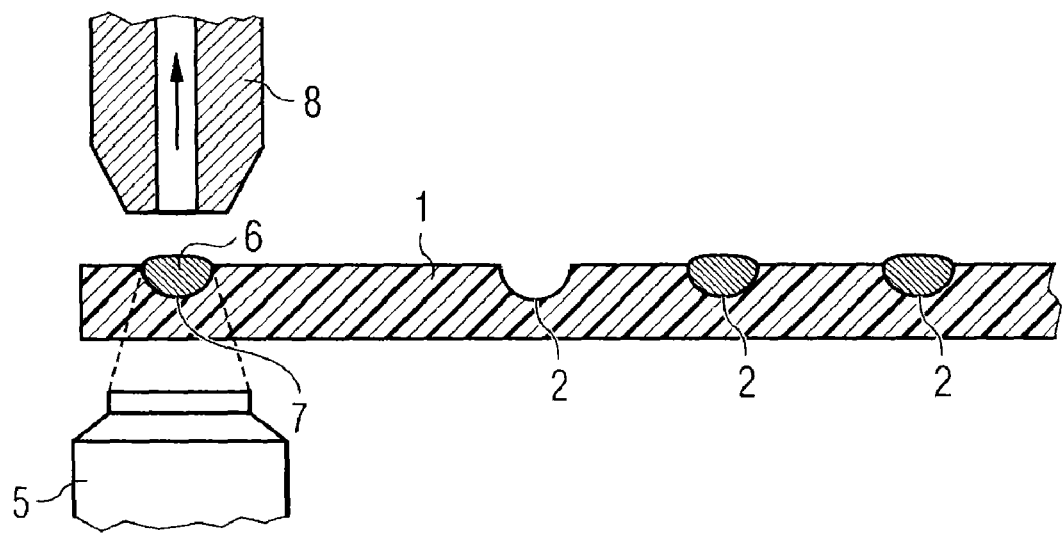
b)
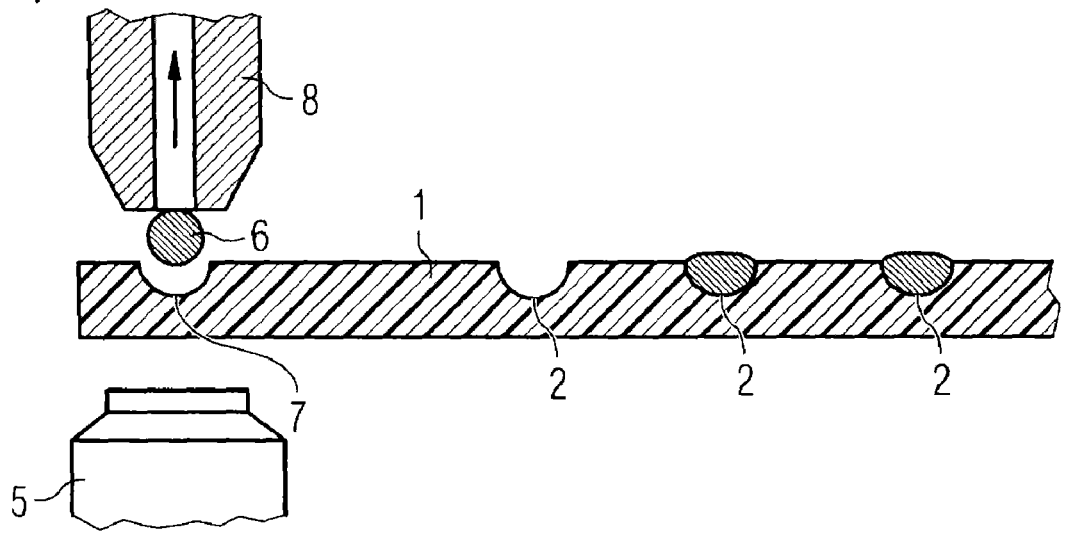

FIG 3
a)
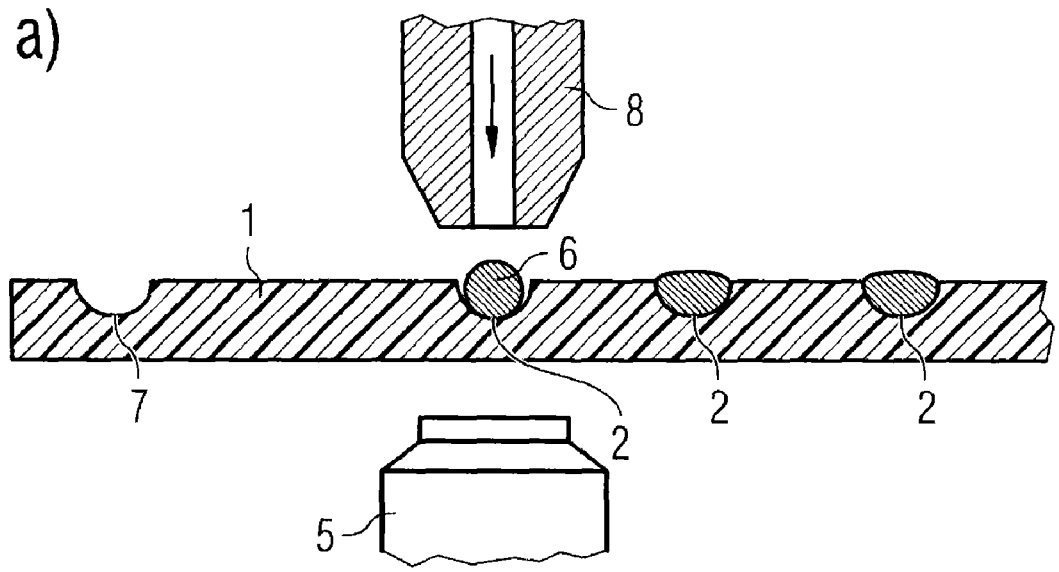
b)
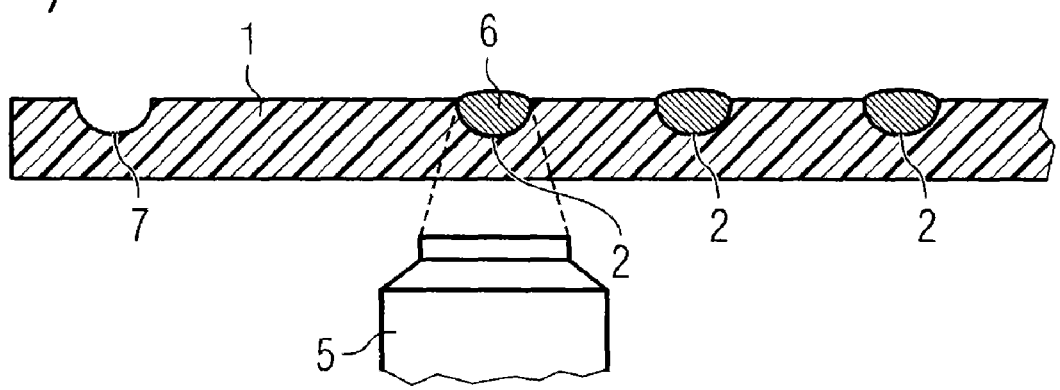

METHOD AND APPARATUS FOR THE CORRECTION OF DEFECTIVE SOLDER BUMP ARRAYS

CROSS REFERENCE TO RELATED APPLICATIONS

This application claims priority of German application No. 10 2007 004 253.3-33 filed on Jan. 23, 2007, the entire disclosure of which is hereby incorporated herein by reference.

BACKGROUND ART

The invention relates to a method for correcting defective solder-bump-arrays and an apparatus for performing said method.

Solder bumps are electrically conducting contact elements and are used, for example, for the production of semiconductor elements according to the flip-chip-technology, in which the chip or die is provided on its active contacting side with solder bumps and subsequently connected to the active side of the substrate (circuit plate, carrier) via said solder bumps, i.e., without any connection cables. Advantages of this technology are the particularly small dimensions of the package yielded in this manner, the smaller dimensions of the connections, and the short connection lengths. This way high connection density, low production costs, and high functionality of the package can be achieved.

Various methods are known to produce solder bumps.

According to a first method the wafer is first coated over its entire surface with metal and subsequently a lacquer reticle is applied, which is provided with openings above the contact sites of the chips. Subsequently, a metal alloy (the solder) is released galvanically and first the lacquer reticle and then the areas of the metal layer not coated by the released solder are removed by selective etching. Then the solder cylinders are melted to small solder bumps (reflow). In the following, the chips or dies are separated by cutting the wafers. The chips are then moistened with a flux material and placed with their active contacting side onto the active side of the substrate. By heating the entire structure the solder bumps are melted and thus an electric connection is created between the contact surfaces of the chips and the contacts of the substrate (reflow soldering).

The solder bumps may also be prefabricated outside the wafer, for example, and subsequently applied to the wafer. For this purpose, a matrix made from glass (mold) is used having a grid in the X-direction and in the Y-direction, on which the solder bumps are arranged for all chips located on a wafer, for example in a so-called solder-bump-array. The mold provides the array-structure to be produced in the form of cavities accepting the solder-bumps. In order to produce the solder bumps these cavities are filled with molten solder using a doctor. After the solder has set the solder bumps are provided in the required arrangement for the entire wafer. In a later process, this arrangement of solder bumps is transferred from the mold onto the chips or dies still located in the wafer-laminate.

It has shown that in this method various defects can occur. For example, it can happen that individual cavities are insufficiently filled with solder or not at all. Other potential defects comprise that individual cavities are filled with too much solder or that neighboring cavities are connected to each other by bridges of soldering material.

In order to ensure the functionality of the dies produced from wafers it is necessary to identify and correct such defects before the solder-bump-array is transferred onto the wafer.

Therefore the object of the present invention is to provide a method and a device to correct defective solder-bump-arrays.

BRIEF SUMMARY OF INVENTION

In the method according to the invention defective solder bumps are searched, identified, and located in an arrangement of solder bumps arranged in cavities of a mold to correct defective solder-bump-arrays, and subsequently replaced by a prefabricated solder bump.

The method also allows first to use defective arrangements of solder bumps, i.e., solder-bump-arrays with one or more missing solder bumps, by replacing missing solder bumps with prefabricated solder bumps. This replacement can be performed in a relatively simple and quick manner and thus allows the use of arrangements that without correction had to be rejected. However, if the defect of the solder-bump-array is of such type that a cavity is filled with too little or too much solder (defective solder bump), said solder must first be removed prior to the execution of the method according to the invention, i.e., the cavity must be cleared before the missing solder bump can be replaced at this site with a prefabricated solder bump.

The missing solder bump can be removed from the cavity, for example, by a targeted energy beam being pointed from the bottom of the mold to said cavity and dosed such that the material of the defective solder bump evaporates at the border surface of said cavity and the developing vapor layer expels the defective solder bump from the cavity. Here, the energy beam is advantageously focused to the cavity using a single high power impulse. Further, it may be provided that the defective solder bump removed from the cavity is suctioned off and removed from the mold. In particular, when the defective solder bump, as described above, is expelled from the cavity it is useful to suction the solder bump off the surface of the mold to avoid contamination.

An advantageous further embodiment of the method provides for the prefabricated solder bump to be removed from a deposit arranged at the edge region of the mold, which contains prefabricated solder bumps arranged in deposit cavities, transported to the cavity of the missing solder bump, and inserted into said cavity. This way, the prefabricated solder bumps provided for said correction are produced in the same processing step as the other solder bumps of the arrangement. Here, it is useful to provide deposit cavities at the edge of the mold, which are also filled with solder.

In this case it can be advantageous for the prefabricated solder bump to be removed from the deposit cavity by pointing an energy beam from the bottom of the mold to the deposit cavity, and dosing it such that the material of the prefabricated solder bump melts at the border surface of the deposit cavity and the prefabricated solder bump separates from the deposit cavity and subsequently the separated prefabricated solder bump is lifted off the deposit cavity.

It is also possible to dose the targeted energy beam such that the material of the prefabricated solder bump evaporates at the border surface of the deposit cavity such that the solder bump is expelled from the deposit cavity by the vapor layer developing. In both cases the energy beam is advantageously pointed with a single high power impulse to the deposit cavity.

In order to repair the defective site within the arrangement it can further be provided for the prefabricated solder bump to be auctioned via a vacuum created by a suitable tool, transported to the cavity of the missing solder bump, and inserted into the cavity by pressure.

In a further embodiment of the method according to the invention it is provided for the prefabricated solder bump to be fixed in the cavity of the missing solder bumps by pointing a targeted energy beam from the bottom of the mold to the cavity and dosing it such that the material of the prefabricated solder bump melts at the border surface to the cavity and that the prefabricated solder bump is adhered to said cavity. This facilitates the later adhesion of the solder bump on the wafer. Here it must be considered advantageous that the energy beam is pointed with several low power impulses to the cavity.

The targeted energy beams used for removing defective solder bumps from the cavity, separating the prefabricated solder bumps from the deposit cavities, and/or fixing the prefabricated solder bumps in the cavity of the missing solder bumps can advantageously embody laser beams. Laser beams can easily be created and without any problems penetrate the molds generally made from glass.

In order to execute the method according to the invention a device is suggested, described in the following:

The device according to the invention for correcting defective solder-bump-arrays in a mold provided with a multitude of cavities provided for accepting solder bumps comprises a mold carrier, an identification and locating device for finding and locating missing solder bumps and a repair device for accepting, transporting, and inserting a prefabricated solder bump into the cavity of the missing solder bump.

Using the described device defective sites of an arrangement of solder bumps on a mold could be easily and quickly identified and repaired so that defective arrangements of solder bumps can be later used for further processing.

In one embodiment of the device it is provided that a separating device for separating a defective solder bump from a cavity is provided and that the mold carrier is supported in a controlled fashion, mobile in reference to the separating device. In particular in cases in which the separating device is embodied to create a targeted energy beam, in an embodiment with a single separating device the energy beam can be pointed to any arbitrary location of the mold, i.e., with a single separating device the defective solder bump can be removed and the prefabricated solder bump can be separated and fixed. For creating a targeted energy beam the separating device can be a laser gun, for example.

The repair device advantageously comprises a small tube, in a controlled manner mobile in reference to the mold carrier, which is embodied to optionally create a vacuum or a high pressure inside the small tube. Such a repair device allows in a simple manner to pick up a prefabricated solder bump, transport it to a cavity, and impress it there.

DETAILED DESCRIPTION

In order to effectively prevent contaminations by solder bumps arranged on the mold, the device according to the invention can also be provided with a suction device for auctioning defective solder bumps separated from a cavity.

In the following, the invention is explained in greater detail using an exemplary embodiment and the corresponding drawing. It shows FIG. 1 the removal of a defective solder bump from a cavity of the mold, FIGS. 2A and 2B the separation and removal of a prefabricated solder bump from a deposit cavity, FIGS. 3A and 3B the deposit and fastening of the prefabricated solder bump in the empty cavity of the mold.

BRIEF DESCRIPTION OF DRAWING FIGURES

The figures show sections of a mold 1 made from glass and supported in a device serving to correct defective solder-bump-array.

FIG. 1 shows a section of the mold 1 comprising a cavity 2, which is part of the above-mentioned array. In the cavity 2 a defective solder bump 3 is located. The defective solder bump 3 was searched, identified, and located in a previous step with the help of a detecting and locating device, so that its position is known. Above the mold 1, a suction tube 4 and below the mold a laser device 5 are arranged as an energy source. The interior diameter of the suction tube 4 is greater than the diameter of a solder bump 3. The suction tube 4 and the laser device 5, on the one hand, and the mold 1, on the other hand, are supported in a horizontal level and mobile in reference to each other, so that each cavity 2 of the array can be approached such that the suction tube 4 and the laser device 5 can act upon any cavity 2. Here, it is irrelevant if the mold 1 is moved inside the device and the suction tube 4 and the laser device 5 are fixed or if the mold 1 is fixed within the device and the suction tube 4 and the laser device 5 are moved.

In order to remove the faulty solder bump 3 from the cavity 2 the laser device 5 emits a high energy laser impulse causing the defective solder bump 3 to separate from the cavity 2 and be ejected in the direction of the suction tube 4. The suction tube 4 creates a vacuum resulting in the defective solder bump 3 to be suctioned into the suction tube 4 and transported off the mold 1. Then the cavity 2 is empty.

FIG. 2A shows how a certain prefabricated solder bump 6 meant to replace the defective solder bump 3 is separated from a deposit cavity 7 allocated to the array, arranged at the edge of the molds 1 and thus outside the actual array. For this purpose, a capillary tube 8 that can be impinged with a vacuum is arranged above the mold 1, with its interior diameter being smaller than the diameter of a solder bump 6. Below the mold 1 a laser device 5 is arranged as an energy source. Here, the laser device 5 may be the same as the one in FIG. 1, however, an additional laser device 5 may also be provided. The capillary tube 8 and the laser device 5, on the one hand, and the mold 1, on the other hand, are supported in a horizontal level mobile in reference to each other so that each deposit cavity 7 can be approached such that the capillary tube 8 and the laser device 5 can act upon each deposit cavity 7. Here, it is irrelevant if the mold 1 is moved inside the arrangement and the capillary tube 8 and the laser device 5 are fixed or the mold 1 is stationary inside the arrangement and the capillary tube 8 and the laser device 5 are moved. In the described exemplary embodiment the deposit cavities 7 are arranged on the mold 1, however, they can also be arranged on a separate carrier substrate.

In order to separate the prefabricated solder bump 6 from the deposit cavity 7 the laser device 5 emits a low-energy laser impulse that causes the prefabricated solder bump 6 to separate from the deposit cavity 7. As shown in FIG. 2B, the capillary tube 8 creates a vacuum resulting in the prefabricated solder bump 6 to be auctioned to the capillary tube 8 to allow its transportation to the empty cavity 2 of the array. Then the deposit cavity 7 is empty.

FIG. 3A shows how the prefabricated solder bump 6, suctioned by the capillary tube 8, is transported from the deposit cavity 7 to the empty cavity 2 inside the array and is deposited here by canceling the vacuum, so that the prefabricated solder bump 6 finally lies in the cavity 2, in which previously the defective solder bump 3 was located. Again, a laser device is located below the mold 1 serving as an energy source. As shown in FIG. 3B, the laser device 5 emits a low energy laser impulse causing the prefabricated solder bump 6 to melt at the border surface to the cavity 2 and subsequently to adhere to the cavity 2 by the material of the solder bump 6 setting.

In the above-described manner and with the described arrangement all defective solder bumps 3 of the array can be replaced one by one by flawless solder bumps 6, so that subsequently a flawless array of solder bumps 3, 6 is available on the mold 1.

The invention claimed is:

1. A method for correcting a defective arrangement of solder bumps located in cavities of a mold comprising: searching, identifying and locating a missing solder bump missing from said arrangement, and subsequently replacing the missing solder bump with a prefabricated solder bump, wherein said replacing comprises removing the prefabricated solder bump from a deposit cavity arranged in an edge region of the mold and transporting the prefabricated solder bump to the cavity of the missing solder bump and inserting the prefabricated solder bump into said cavity, and wherein the prefabricated solder bump is released from the deposit cavity by a targeted energy beam being pointed to the deposit cavity from a bottom of the mold and is dosed such that material of the prefabricated solder bump melts at a border surface to the deposit cavity and the prefabricated solder bump separates from the deposit cavity and subsequently the separated prefabricated solder bump is lifted off the deposit cavity.

2. A method according to claim 1, wherein the targeted energy beam comprises a single high power impulse.

3. A method according to claim 1, wherein the prefabricated solder bump is suctioned by a vacuum, transported to the cavity of the missing solder bump, and inserted into the cavity by pressure.

4. A method according to claim 1, wherein the targeted energy beam comprises a laser beam.

5. The method according to claim 1, further comprising initially identifying and removing a faulty solder bump from the arrangement.

6. A method for correcting a defective arrangement of solder bumps located in cavities of a mold comprising: searching, identifying and locating a missing solder bump missing from said arrangement, and subsequently replacing the missing solder bump with a prefabricated solder bump, wherein said replacing comprises removing the prefabricated solder bump from a deposit cavity arranged in an edge region of the mold and transporting the prefabricated solder bump to the cavity of the missing solder bump and inserting the prefabricated solder bump into said cavity, wherein the prefabricated solder bump is removed from the deposit cavity by pointing a targeted energy beam from a bottom of the mold to the deposit cavity, dosed such that material of the prefabricated solder bump evaporates at a border surface to the deposit cavity and a developing vapor layer ejects the prefabricated solder bump from the deposit cavity.

7. A method according to claim 6, wherein the targeted energy beam comprises a single high power impulse.

8. The method according to claim 6, further comprising initially identifying and removing a faulty solder bump from the arrangement.

9. A method for correcting a defective arrangement of solder bumps located in cavities of a mold comprising: searching, identifying and locating a missing solder bump missing from said arrangement, and subsequently replacing the missing solder bump with a prefabricated solder bump, wherein said replacing comprises removing the prefabricated solder bump from a deposit cavity arranged in an edge region of the mold and transporting the prefabricated solder bump to the cavity of the missing solder bump and inserting the prefabricated solder bump into said cavity, wherein the prefabricated solder bump is fixed in the cavity of the missing solder bump by a targeted energy beam being pointed from a bottom of the mold to the cavity and dosed such that material of the prefabricated solder bump melts at a bordering surface to the cavity and adheres the prefabricated solder bump to the cavity.

10. A method according to claim 9, wherein the energy beam used to fix the prefabricated solder bump comprises several low power impulses.

11. A method according to claim 9, wherein the targeted energy beam comprises a laser beam.

12. The method according to claim 9, further comprising initially identifying and removing a faulty solder bump from the arrangement.

13. A device for correcting a defective arrangement of solder bumps located in cavities of a mold comprising: a mold carrier, an identification and locating device for finding and locating a missing solder bump, missing from said arrangement; a repair device for accepting, transporting, and inserting a prefabricated solder bump from a deposit cavity in an edge region of the mold into a cavity of the missing solder bump, and a release device employing a targeted energy beam directed at the deposit cavity from bottom of the mold to release the prefabricated solder bump from the deposit cavity.

14. A device according to claim 13, further comprising a separating device for separating a defective solder bump from a cavity and wherein the mold carrier is controllably moveable relative to the separating device.

15. A device according to claim 13, wherein the separating device comprises a laser gun.

16. A device according to claim 13, wherein the repair device comprises a small tube controllably moveable relative to the mold carrier, and operational to optionally create a vacuum or a pressure inside the tube.

17. The device according to claim 13, wherein the targeted energy beam causes the prefabricated solder bump to melt or evaporate at a border surface of the deposit cavity and then separate from the deposit cavity.

\* \* \* \* \*